United States Patent
Richards

(10) Patent No.: US 6,809,977 B1
(45) Date of Patent: Oct. 26, 2004

(54) METHOD FOR READING AND WRITING MEMORY CELLS OF SPATIAL LIGHT MODULATORS USED IN DISPLAY SYSTEMS

(75) Inventor: Peter W. Richards, Menlo Park, CA (US)

(73) Assignee: Reflectivity, INC, Sunnyvale, CA (US)

( * ) Notice: Subject to any disclaimer, the term of this patent is extended or adjusted under 35 U.S.C. 154(b) by 53 days.

(21) Appl. No.: 10/406,338

(22) Filed: Apr. 2, 2003

(51) Int. Cl.[7] .............................................. G11C 7/02
(52) U.S. Cl. ..................................... 365/210; 365/215
(58) Field of Search ................................ 365/210, 149, 365/189.04, 215

(56) References Cited

U.S. PATENT DOCUMENTS

| | | | |
|---|---|---|---|
| 5,132,928 A | | 7/1992 | Hayashikoshi et al. |
| 5,452,244 A | * | 9/1995 | Mohan Rao ................ 365/149 |
| 6,577,548 B1 | * | 6/2003 | Barth et al. ................. 365/210 |
| 2002/0138688 A1 | | 9/2002 | Hsu et al. |

OTHER PUBLICATIONS

Klompenhouwer, et al. Optimally Reducing Motion Artifacts in Plasma Displays, Philips Research Laboratories, SID 00 Digest, pp. 388–391.

Baker, et al, CMOS Circuit Design, Layout and Simulation, IEEE Press Series on Microelectronic Systems, IEEE Press, New York, pp. 345–348.

\* cited by examiner

*Primary Examiner*—Thong Le
(74) *Attorney, Agent, or Firm*—Gregory R. Muir

(57) ABSTRACT

A spatial light modulator comprising a memory cell array for use in display systems and a method of operating the memory cell array have been disclosed herein. The memory cell array comprises one or more rows of memory cells. Each row of memory cells is provided with a plurality of wordlines so that the memory cells in a row can be activated separately and independently. Memory cells connected to different wordlines in the same row, and the memory cells connected to different wordlines in different rows can be activated synchronized or asynchonized as desired. With is configuration, perceived artifacts, such as perceived dynamic-false-contouring artifacts, can be suppressed, if not eliminated. A row of reference memory cells can be formed within the memory cell array. The reference memory cells can maintain a predefined reference voltage state that is different from the voltage states maintained by the other memory cells of the memory cell array. The row of the reference memory cells is provided with a plurality of wordlines for activating the reference memory cells. With the reference memory cells, the voltage state of a memory cell of the memory cell array can be read.

14 Claims, 14 Drawing Sheets

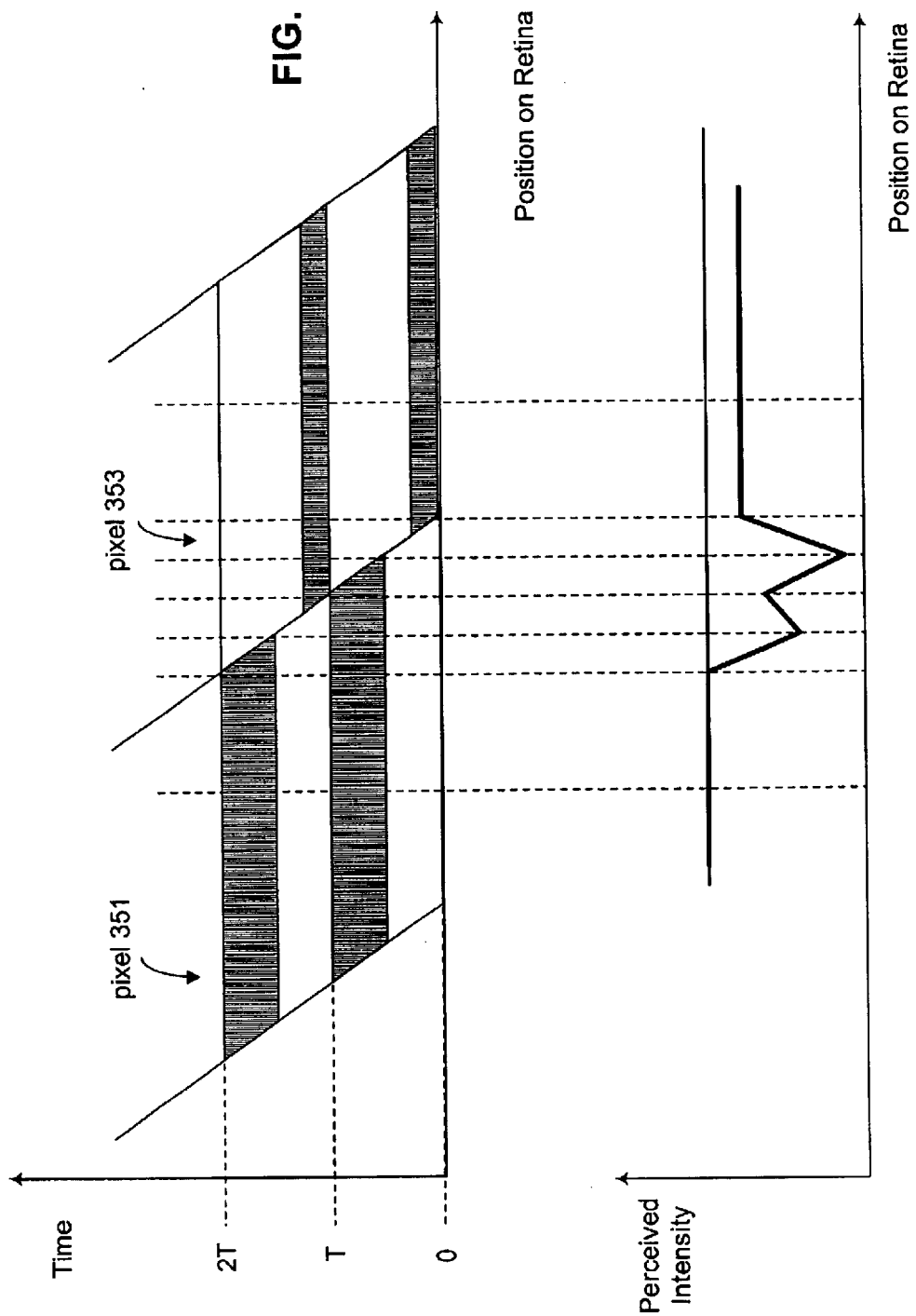

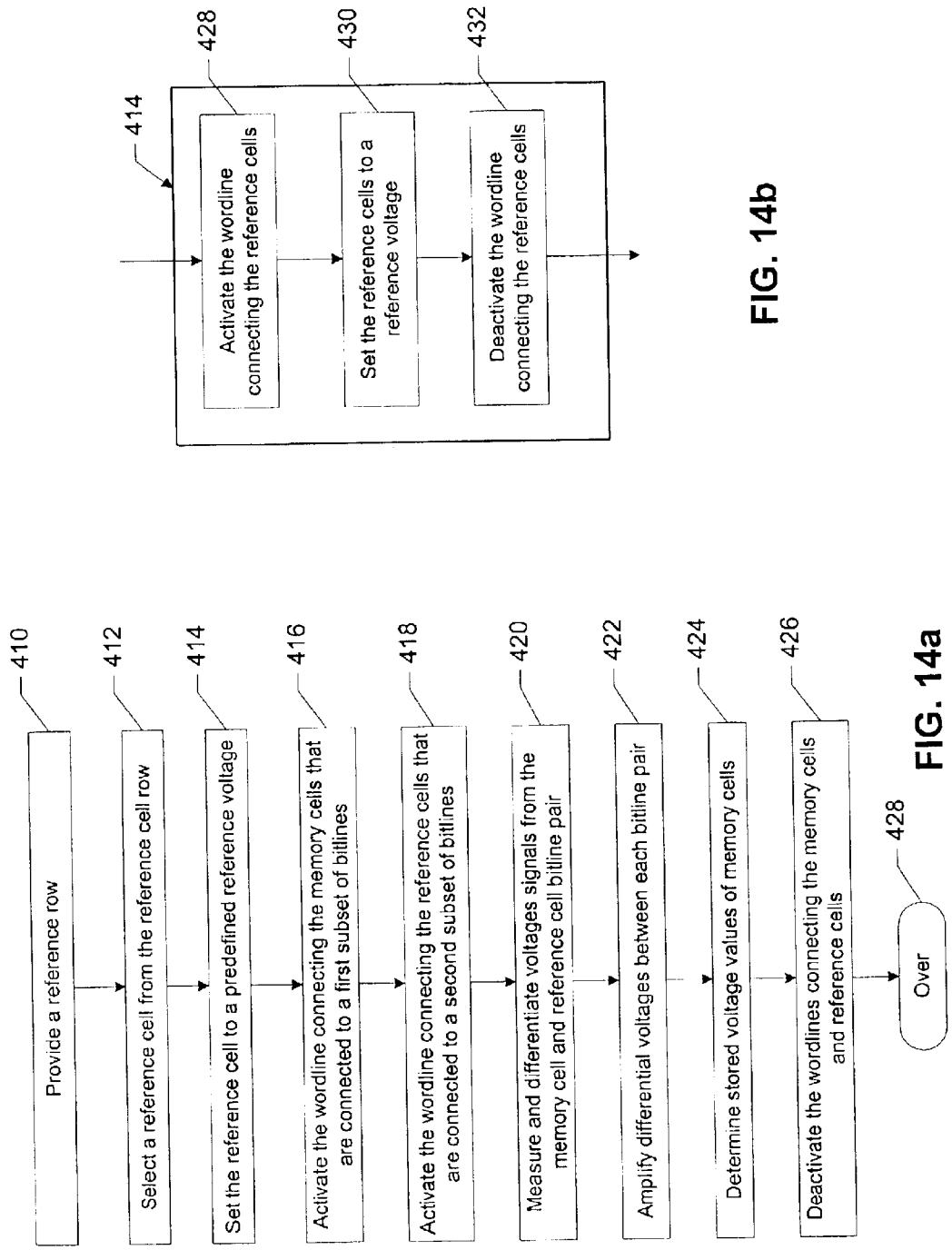

METHOD FOR READING AND WRITING MEMORY CELLS OF SPATIAL LIGHT MODULATORS USED IN DISPLAY SYSTEMS

TECHNICAL FIELD OF THE INVENTION

The present invention is related generally to memory cells, and, more particularly, to memory cell arrays used in display systems.

BACKGROUND OF THE INVENTION

In current memory cell arrays, memory cells in a row of the array are connected to a single wordline for activating the memory cells. For example, in a typical Dynamic Random Access memory (DRAM) cell array as illustrated in FIG. 1, DRAM cells of row 110 are connected to and activated by wordline 112. A critical constraint on this type of design is that, regardless of the user's intention, the wordline activates all memory cells of the row simultaneously for writing the intended memory cells during a writing cycle. Consequently, the timing of write events is highly correlated. This time-correlation may cause artifacts, such as dynamic-false-contouring (DFC) in display systems that employ memory cell arrays for controlling the pixels of the display systems and pulse-width-modulation (PWM) technique for displaying gray-scales of images.

As a way of example, FIGS. 2a to 2d illustrate the formation of DFC artifacts in the boundary of two neighboring pixels that are controlled by two neighboring memory cells sharing one wordline. Referring to FIG. 2a, pixels 351 and 353 are two neighboring pixels of the display system and are controlled by two neighboring memory cell, such as memory cells 113 and 115 in FIG. 1. Assuming that gray-scaled images of an object traversing from left to right are to be displayed by the two pixels, illumination intensities of the two pixels are modulated using PWM waveforms such that, in the screen (pixel) coordinate, the averaged illumination intensity over a frame duration T of each pixel corresponds to the desired grayscale of the image. As viewed by stationary human eyes, the difference of the averaged illumination intensity at the boundary of the two pixels is perceived as the contour of the object, as shown in FIG. 2b.

However, the contour of the object will be distorted in the retina coordinate in viewer's eye when the eyes move with the object. FIG. 2c presents the two pixels in the retina coordinate that moves with the eyes and the object. As can be seen, the pixels are distorted. The boundary of the two pixels is extended into a region, in which the averaged illumination intensity varies with position, as shown in FIG. 2d. This variation of the averaged illumination intensity will be perceived and recognized by the eyes as "real" contour of the object. This phenomenon is generally referred to as DFC artifact.

Therefore, methods and apparatus are desired for decorrelating the memory cells and associated pixels of a spatial light modulator such that the DFC like artifacts can be effectively reduced, if not removable.

SUMMARY OF THE INVENTION

In view of the foregoing, the present invention provides a method for operating memory cells in each row of the memory cell arrays such that the update events of neighboring memory cells are decorrelated in time. The pixels corresponding to the memory cells are also time-decorrelated thereby. As a benefit of the present invention, stored voltage states of the memory cells of the memory cell array can be read.

In an embodiment of the invention, a method is disclosed herein. The method comprises: providing a memory-cell array comprising a plurality of memory cells; and activating the memory cells of a row of the array using a plurality of separate word lines of the row such that at least two memory cells of the row are activated by separate word lines.

In another embodiment of the invention, a method for displaying a gray-scale image is disclosed herein. The method comprises: providing a spatial light modulator comprising an array of pixel elements; defining at least a first and a second waveform format based on a pulse-width-modulation technique; defining at least a first set of waveforms according to the first waveform format and the gray scale of the image; defining at least a second set of waveforms according to at least the second waveform format; updating the pixels of a row of the array in accordance with a plurality of waveforms that are selected from the first and second sets of waveforms such that at least a first pixel of the row is written in accordance with at least a first waveform selected from the first set of waveforms, and at least a second pixel other than the first pixel of the row is written in accordance with at least a second waveform selected from the second set of waveforms.

In yet another embodiment of the invention, a system is provided herein. The system comprises: a memory-cell array comprising a plurality of memory cells; and a plurality of word-lines coupled to the memory cells of a row of the memory-cell array for selectively activating the memory cells such that at least two memory cells of the row are coupled to separate word-lines of the plurality of word-lines.

In a further embodiment of the invention, a display system for displaying a gray-scale image on a target is proved herein. The display system comprises: a light source; a spatial light modulator that employs a pulse-width-modulation technique for displaying the image by reflecting a beam of incident light from the light source and selectively directing the reflected light to the target, the spatial light modulator further comprising: a plurality of micromirrors for selectively reflecting the beam of incident light onto the target; a memory-cell array having a plurality of memory cells for storing a set of information for controlling the deflections of the micromirrors; and a plurality of word lines coupled with the memory cells of a row of the memory-cell array for activating the memory cells for updating the stored information such that at least two different memory cells of the row can be actuated by separate word lines of the plurality of word lines.

In still a further embodiment of the invention, a method for displaying a gray-scale image on a target is disclosed herein. The method comprises: defining a set of separate waveforms in accordance with at least a gray-scale information of the image and based on a pulse-width-modulation technique; directing an incident light onto a micromirror array that has a plurality of deflectable reflective micromirrors; and selectively reflecting, by the micromirror array, the incident light onto the target according to the set of separate waveforms such that at least two different micromirrors of a row of the array reflect the incident light according to at least two separate waveforms.

In yet another embodiment of the invention, a method for displaying an image is disclosed herein. The method comprises: providing a spatial light modulator having rows and columns of pixels in an array; addressing pixels within a row of the array by providing a brightness level to each pixel in the row, the brightness level being achieved by activating each pixel with a series of bits of varying different lengths, wherein the combination of "on" bits during a frame corresponds to a brightness level for each pixel; and wherein the order of the series of bits for each pixel in a row is not the same or the weightings of the series of bits are different.

In still yet another embodiment of the invention, a method for displaying an image is disclosed herein. The method comprises: providing a spatial light modulator having rows and columns of pixels in an array; addressing pixels within a row of the array by providing a brightness level to each pixel in the row, the brightness level being achieved by activating each pixel with a series of bits of different lengths, wherein a plurality of pixels in the row have the same brightness level but a different combination of "on" and "off" bits during a frame.

In yet another embodiment of the invention, a spatial light modulator is provided herein. The spatial light modulator comprises: a plurality of rows and columns of pixels in an array; a bit line for each column; and a plurality of word lines for a row of the plurality of rows.

In a further embodiment of the invention, a method for reading voltage states of the memory cells of the memory cell array used of a spatial light modulator is disclosed herein. The method comprises: providing a spatial light modulator that further comprises a memory cell array, the array comprising a reference row, and each row of the array being connected to a plurality of wordlines; reading a voltage state of a memory cell of a memory-cell array, further comprising: selecting a reference cell from the reference row, wherein the selected reference cell being connected to a wordline different from a wordline connecting a reference cell that is connected to the same bitline as the memory cell being read; setting the selected reference cell to a predefined voltage; activating the memory cell being read; activating the selected reference cell; measuring a reference voltage signal from the bitline connecting the selected reference cell and a voltage signal from a bitline connecting the memory cell being read; comparing the reference voltage signal and the voltage signal; determining the voltage state of the memory cell based on the comparison.

In another embodiment of the invention, a system is provided herein. The system comprises: a memory cell array comprising a plurality of memory cells; a first and second sets of wordlines connected to the memory cells for activating the memory cells; wherein at least two memory cells of each row of the memory cell array are connected to at least two separate wordlines selected from the first and second sets of wordlines; wherein the memory cells connecting the first set of wordlines are connected to a first set of bitlines; and wherein the memory cells connecting the second set of wordlines are connected to a second set of bitlines; a row of reference memory cells comprising a plurality of reference memory cells, wherein at least two reference memory cells are respectively connected to two separate wordlines selected from first and second sets of wordlines; and wherein the reference memory cells connected to the wordline of the first set of wordlines are connected to the first set of bitlines; and wherein the reference memory cells connected to the wordline of the second set of wordlines are connected to the second set of bitlines; a plurality of electrodes, each of which is connected to one of the memory cells of the memory cell array such that the voltage of the electrode is determined by the voltage maintained by the connected memory cell; and a plurality of micromirrors, each of which is electrostatically controlled by one of the plurality of electrodes.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIGS. 2a through 2d illustrate a perceived dynamic-false-contouring artifact at the boundary of two neighboring memory cells; wherein FIG. 2a presents the two neighboring cells showing grayscales of a moving object in the screen coordinate; wherein FIG. 2b the shows perceived illumination intensity by the eyes of the shown grayscales of FIG. 2a in the screen coordinate; wherein FIG. 2c presents the two neighboring cells showing grayscales in the retina coordinate that moves with the moving object; and wherein FIG. 2d presents the perceived illumination intensity of the shown grayscales of FIG. 2c in the retina coordinate;

FIG. 6b and FIG. 6c illustrate two exemplary binary-weighted pulse-width-modulation waveforms generated according to the waveform format in FIG. 6a;

FIG. 10a illustrates a row of pixels viewed by viewer eyes, the pixels showing a gray-scaled image of a moving object according to an embodiment if the invention, and the viewer eyes following the motion of the moving object FIG. 10b demonstrate the perceived illumination intensity of the pixels in FIG. 10a;

FIG. 14a and FIG. 14b are flow charts illustrating exemplary steps executed for reading a voltage state of a memory cell of a memory cell array according to an embodiment of the invention.

DETAILED DESCRIPTION OF THE INVENTION

Memory Cell Array with Multiple Wordlines

Figure 1:
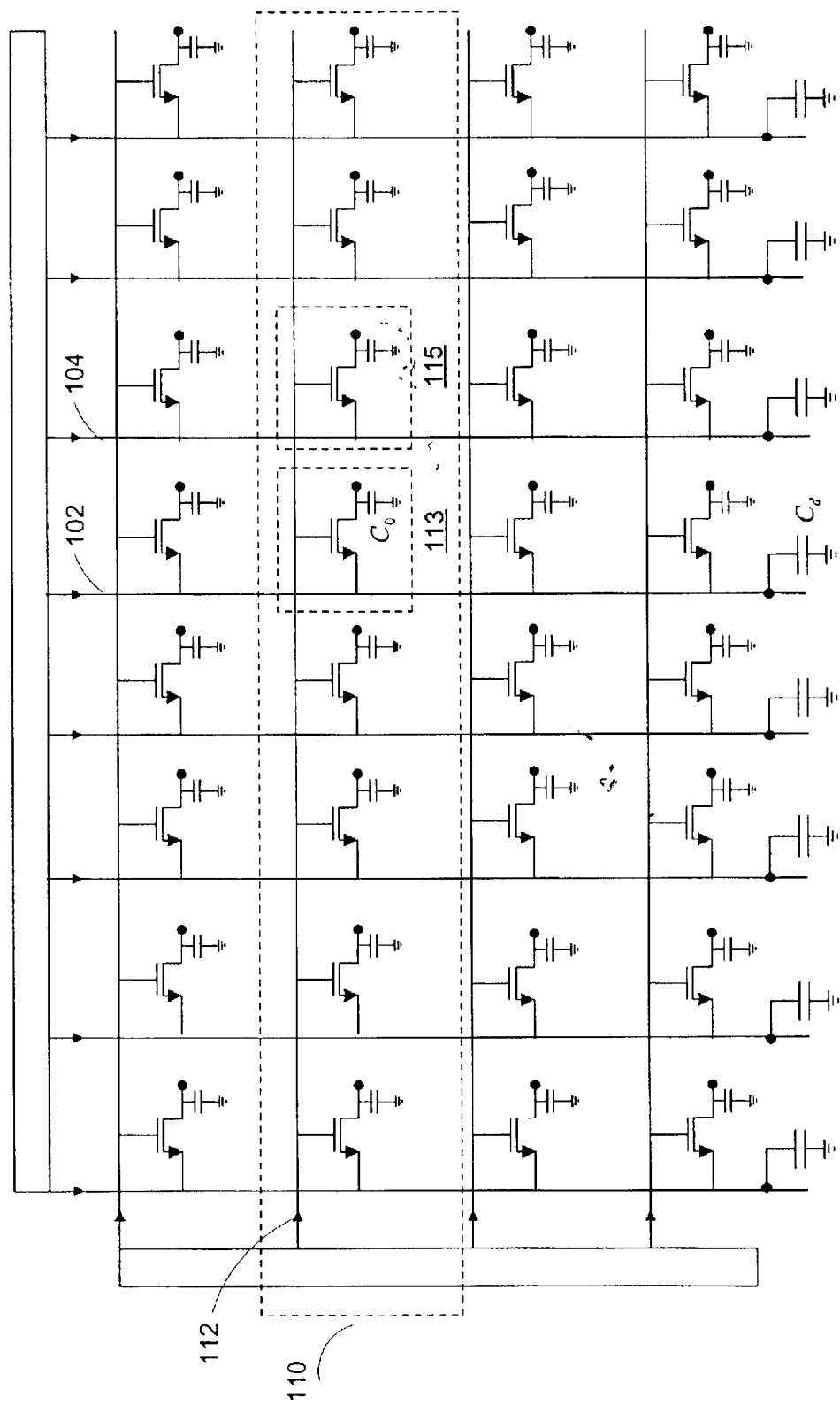
FIG. 1 presents a typical memory-cell array in prior art.
Figure 2A:
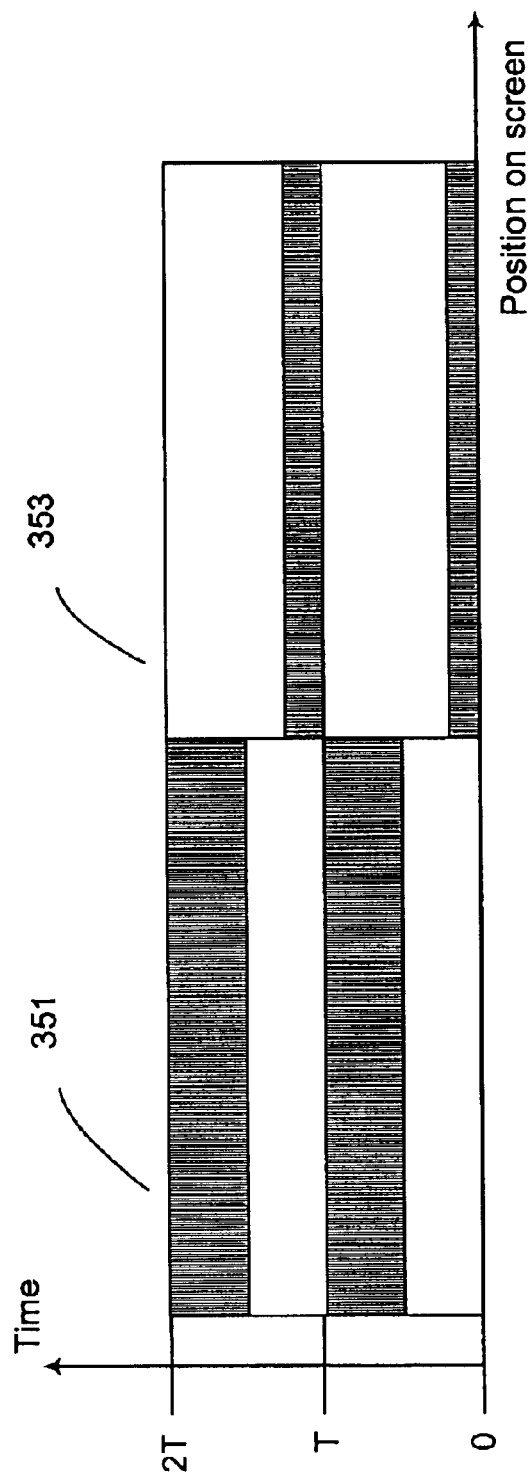
Figure 2B:
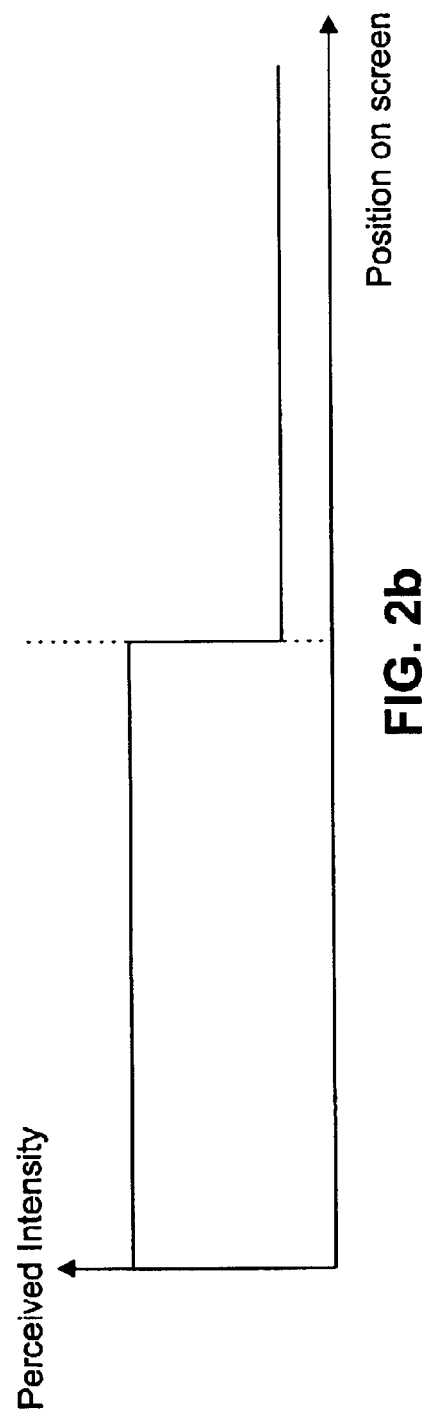

The present invention provides a method for operating memory cells of a memory cell array by providing multiple wordlines to each row such that the timing of update events to memory cells in the row are decorrelated. In display systems employing memory cells for controlling the pixels of the display system and pulse-width-modulation technique for generating grayscales or color, the decorrelation of the memory cells reduces correlation of neighboring pixels. The dynamic-false-contouring artifacts are thereby reduced. In another application, the multiple wordlines of each row of the memory cell array enable read back of voltages stored in memory cells, enhancing the device's testability.

To selectively update memory cells of a row of a memory cell array, the memory cells of the row are divided into subgroups according to a predefined criterion. For example, neighboring memory cells in a row are grouped into separate subgroups. For another example, the positions of the memory cells in a row in different subgroups are interleaved. A plurality of wordlines is provided for each row of the memory cell array. The memory cells are connected to the plurality of wordlines such that memory cells in the same subgroup are connected to the same wordline, and memory cells in different subgroups are connected to separate wordlines. With this configuration, memory cells in different subgroups are activated or updated independently by separate wordlines. Memory cells in different subgroups of the row can be activated asynchronously or synchronously as desired by scheduling the activation events of the wordlines. Moreover, memory cells in different rows of the memory cell array can be selectively updated asynchronously or synchronously as desired. For example, one can simultaneously update memory cells in a subgroup (e.g. even numbered memory cells) of a row and memory cells in another subgroup (e.g. odd numbered memory cells) of a different row. Of course, memory cells in different subgroups of different rows can be activated at different times, In an application of display systems that employ memory cell arrays for controlling the pixels of the system and pulse-width-modulation technique, perceived artifacts, such as dynamic-false-contouring (DFC) artifacts can be reduced, if not removed. To attain this purpose, the original DFC artifacts, which are formed at the boundaries of neighboring pixels having different gray scales, are intentionally reproduced and distributed over the entire pixel row. As a result, the reproduced and the original DFC artifacts are redistributed at a higher spatial frequency. That is, the original DFC artifacts will no longer be recognized by viewer as the "real" contour of the object.

To redistribute the DFC artifacts, illumination-intensity modulations are performed differently at the neighboring pixels of the row. As a result, the averaged illumination intensity at each boundary of neighboring pixels varies and forms DFC artifacts. In order to modulate the neighboring pixels in different ways, the memory cells controlling the neighboring pixels are expected to be activated or updated independently. The present invention provides multiple wordlines for the memory cells in each row of the memory cell array. This enables the memory cells controlling the selected neighboring pixels to be connected to and activated by separate wordlines.

Embodiments of the present invention can be implemented in a variety of ways and systems, such as optical switches and display systems. In the following, embodiments of the present invention will be discussed in a display system that employs micromirror arrays and PWM technique, wherein individual micromirrors of the micromirror array are controlled by memory cells. For clarity and demonstration purposes without losing generality, the embodiments will be illustrated using a simplified 4-bit grayscale on a memory cell array. It will be understood that the embodiments of the present invention are applicable to any grayscale or color pulse-width-modulation waveform, such as those described in U.S. Pat. No. 6,388,661, and U.S. patent application Ser. No. 10/340,162, filed on Jan. 10, 2003, both to Richards, the subject matter of each being incorporated herein by reference. Each memory cell of the array may be a 1T1C (one transistor and one capacitor) circuit. Each row of the memory cell array is provided with at least two wordlines. It will be apparent to one of ordinary skill in the art that the following discussion applies generally to other types of memory cells, such as DRAM, SRAM or latch. The wordlines for each row of the memory array can be of any suitable number equal to or larger than two. Other PWM waveforms (e.g. other bit-depths and/or non binary weightings) may also be applied. Furthermore, although not limited thereto, the present invention is particularly useful for operating micromirrors such as those described in U.S. Pat. No. 5,835,256, the contents of which are hereby incorporated by reference.

Figure 3:
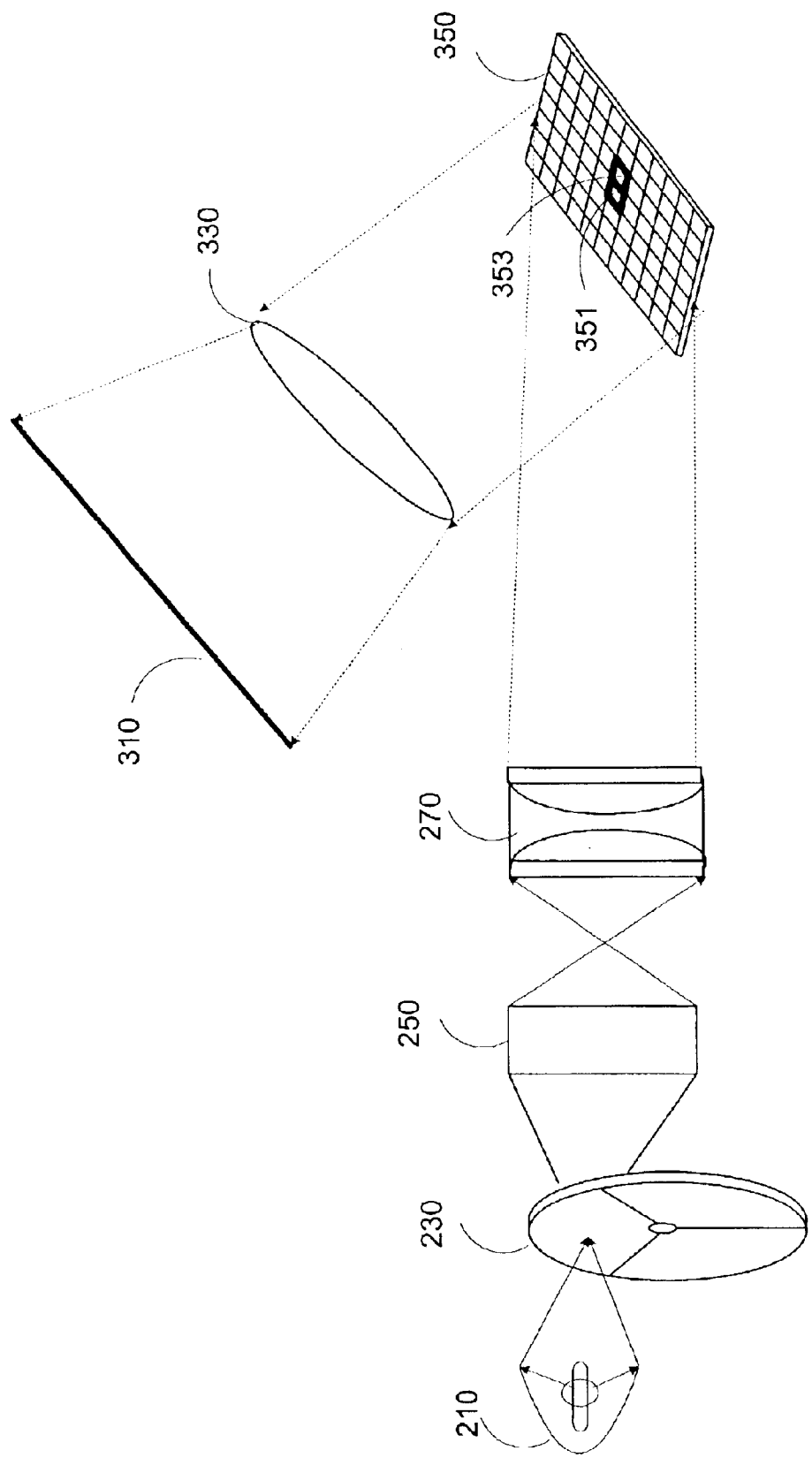
FIG. 3 shows a simplified display system that employs a MEMS-based spatial light modulator.

Referring to FIG. 3, a simplified display system, in which embodiments of the presented invention may be implemented, is illustrated therein. The display system employs a spatial light modulator (hereafter, SLM) and pulse-width-modulation technique. A light source 210 and associated optical devices, such as light pipe 250, optical lens 270, focus a light beam onto SLM 350. T he pixels of SLM are individually controllable and an image is formed by modulating the incident light beam as desired at each pixel. Modulated light from each SLM pixel passes through projection lens 330 and is projected onto display target 310, which shows an image composed of bright and dark pixels corresponding to the image data loaded into the SLM.

In order to produce the perception of a gray-scale or full color image in such a display system, it is necessary to rapidly modulate the pixels between "ON" and "OFF" states such that the average over a time period (e.g. the time period corresponds to the critical flicker frequency) of their modulated brightness corresponds to the desired "analog" brightness for each pixel. This technique is generally referred to as pulse-width-modulation (PWM). Above a certain modulation frequency, the viewer eyes and brain integrate a pixel's rapidly varying brightness and perceived brightness determined by the pixel's average illumination over a period of time. In particular, display of color-images can be achieved using for example, field-sequential color display techniques. A "field-sequential color display" can be generated by temporally interleaving separate images in different colors, typically primaries red, green and blue. This is accomplished using a color filter wheel, which has at least three primary color sections. As color wheel rotates rapidly, the color of the reproduced image cycles rapidly between the desired colors. The image on the spatial light modulator is synchronized to the color wheel such that the different color fields of the full-color images are displayed in sequence. When the color from the wheel is varied rapidly enough, the human eye perceives the sequential color fields as a single full-color image. The modulation of illumination of pixels is controlled by a memory cell array associated with the pixels of the display system.

Figure 4:
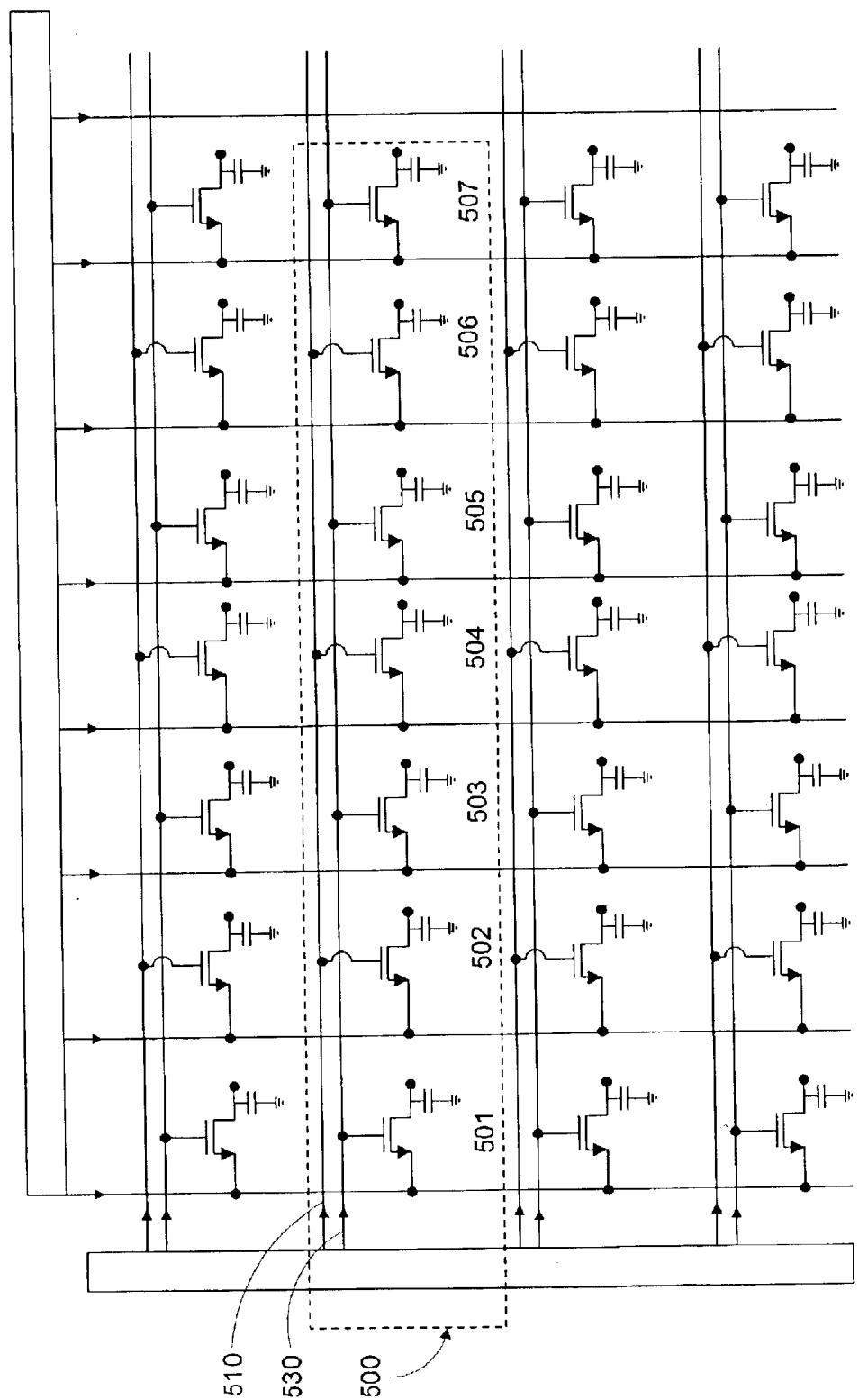
FIG. 4 illustrates a memory cell array having dual word-lines for each row of memory cells according to an embodiment of the invention.

Referring to FIG. 4, a memory cell array according to an embodiment of the invention is illustrated therein. The memory cell array has two wordlines for each row of the array, and memory cells of a row are connected to separate wordlines. For example, memory cell row 500 has two separate wordlines 510 and 530. Neighboring memory cells of each row are connected to separate wordlines. Specifically, odd numbered memory cells are in one subgroup, and even numbered memory cells are in another subgroup. Memory cells in different subgroups are connected to separate wordlines. For example, memory cells 501 and 502 are respectively connected to wordlines 530 and 510. Memory cells in the same subgroup are connected to the same wordline. For example, memory cells 501 and 503 (or memory cells 502 and 504) are connected to wordline 530 (or 510). With this configuration, neighboring memory cells can be activated separately. The time-correlation between neighboring pixels in current memory cell arrays can thus be removed. In an aspect of the invention, neighboring memory cells can also be activated asynchronously or synchronously as desired by properly scheduling the activation events of the wordlines. For example, memory cell 501 can be activated earlier via wordline 530 than memory cell 502 via wordline 510. Of course, the two wordlines can also be synchronized, and all memory cells in the row (e.g. row 500) can be activated at the same time by synchronizing the wordlines.

Figure 5A:
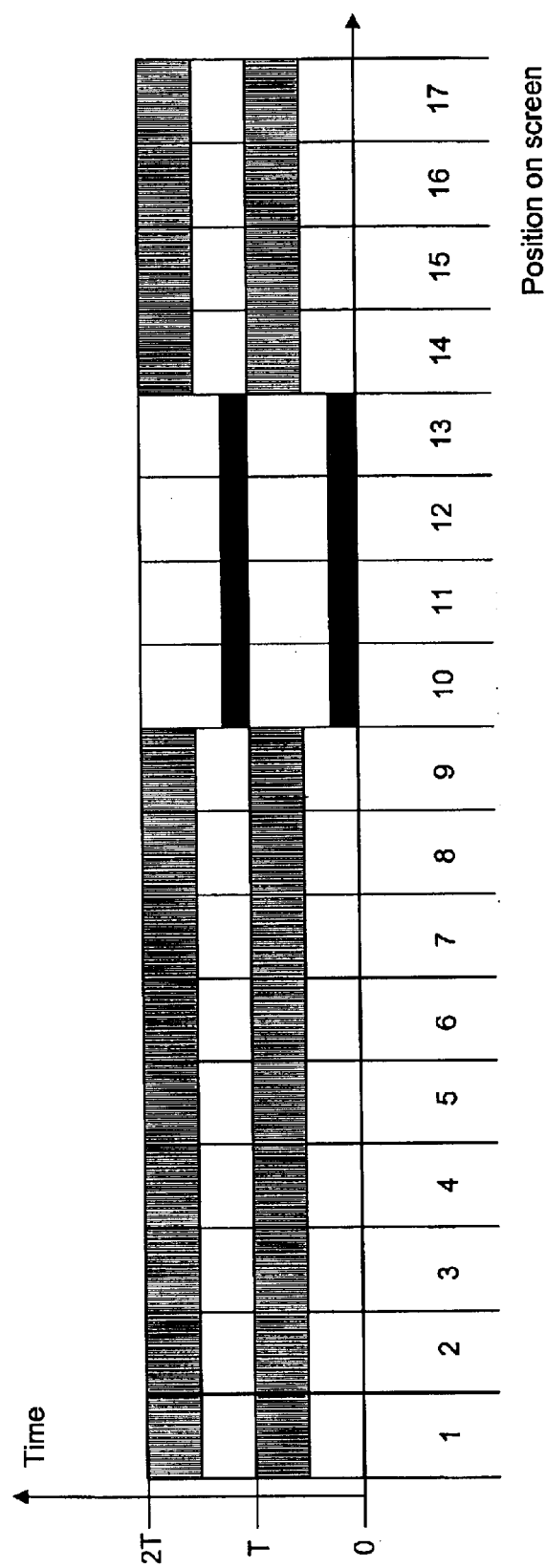
FIG. 5a illustrates a row of pixels displaying gray-scaled images of a moving object in the screen coordinate.

Under the control of the memory cell array in FIG. 4, DFC artifacts can be reduced in the display system in FIG. 3. For simplicity and illustration purposes, gray-scaled images of an object that moves from left to right are to be displayed by a row of pixels of the spatial light modulator 350 in FIG. 3. Referring to FIG. 5a, the pixel row has 17 pixels numbered from 1 to 17. Each of the pixels is associated with a memory cell of row 500 in FIG. 4 for electrostatically controlling the pixel.

Figure 6A:
FIG. 6a demonstrates a 4-bits binary-weighted waveform format.
Figure 7:
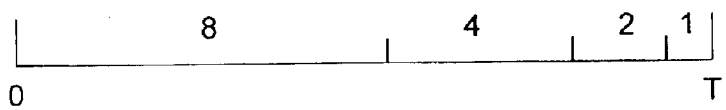
FIG. 7 shows another exemplary binary-weighted waveform format according to another embodiment of the invention.
Figure 9A:
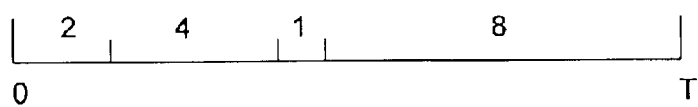
FIG. 9a present yet another exemplary waveform format according to yet another embodiment of the invention.
Figure 9B:
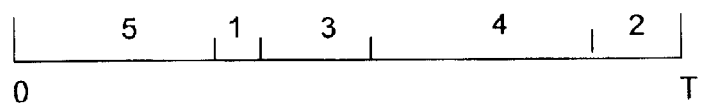
FIG. 9b presents a further exemplary waveform format according to a further embodiment of the invention.

In order to simulate grayscales of the moving object, PWM waveforms are generated according to the predefined PWM waveform formats and the desired grayscales. In the embodiment of the invention, at least two binary-weighted PWM waveform formats are defined. A first PWM waveform format is a binary-weighted waveform format starting from the least significant bit (LSB) and ending at the most significant bit (MSB), as shown in FIG. 6a. A second PWM waveform format is a binary-weighted waveform format starting from the MSB and ending at the LSB, as shown in FIG. 7. Though preferred, other suitable waveform formats could also be applied. In particular, the waveform format can be a binary-weighted format with the binary weights randomly arranged, as shown in FIG. 9a. Alternatively, the waveform format can be non-binary weighted format, as shown in FIG. 9b.

Figure 8A:
FIG. 8a and FIG. 8b present two exemplary waveforms generated according to the waveform format in FIG. 7.
Figure 8B:

Given the defined waveform formats, PWM waveforms are generated according to the desired grayscales. For example, PWM waveforms shown in FIGS. 6b and 6c are generated based on the defined format of FIG. 6a. And PWM waveforms shown in FIGS. 8a and 8b are generated based on the defined format of FIG. 7. Referring to FIG. 6b, the waveform is in the "OFF" state during the first 7 (7=1+2+4) segments of the frame duration T and turned "ON" for the rest 8 segments. Referring to FIG. 6c, the waveform presented therein is turned "ON" for the first 3 (3=1+2) segments of the frame duration T and turned "OFF" for the rest 12 (12=4+8) segments. By feeding the waveforms shown in FIGS. 6b and 6c into the pixels in FIG. 5a, illumination intensities of the pixels are modulated over the frame duration T. Specifically, within the first duration T, pixels 1 through 9, and 14 through 17 are turned "OFF" (dark) during the first 7 segments of the frame duration T. These pixels are then turned "ON" (bright) for the rest 8 segments. Pixels 10 through 13 are first turned "ON" for the first 3 waveform segments and turned "OFF" for the rest 12 segments. The modulation is repeated for the following frame duration (e.g. from T to 2T). In this way, illumination intensities are distributed over the 17 pixels during the frame duration T. This illumination pattern, however, is distorted in the retina coordinate of viewer's eyes that moves with the moving object, as shown in FIG. 5b.

Figure 5B:
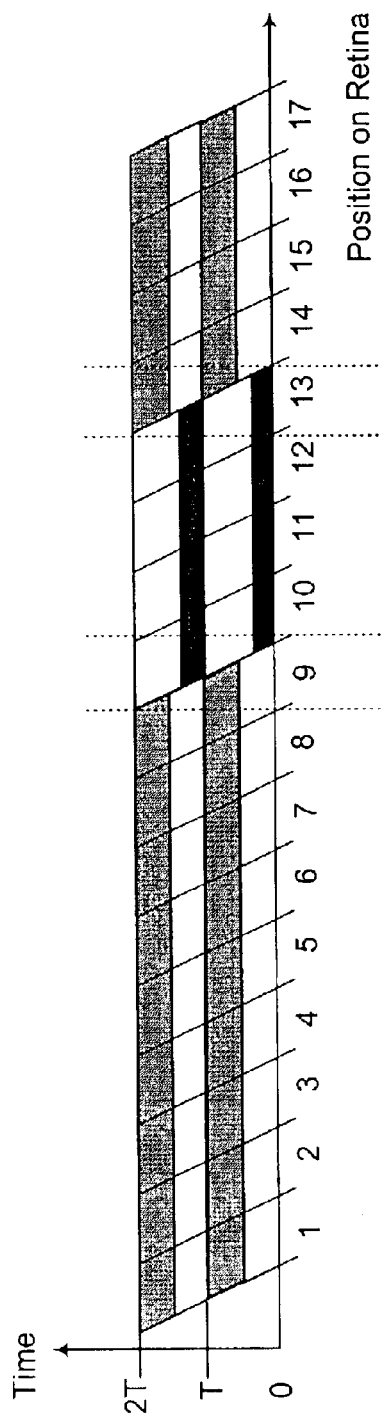
FIG. 5b illustrates a row of prior art pixels viewed by viewer eyes, the pixels showing a gray-scaled image of a moving object, and the viewer eyes following the motion of the moving object.
Figure 5C:
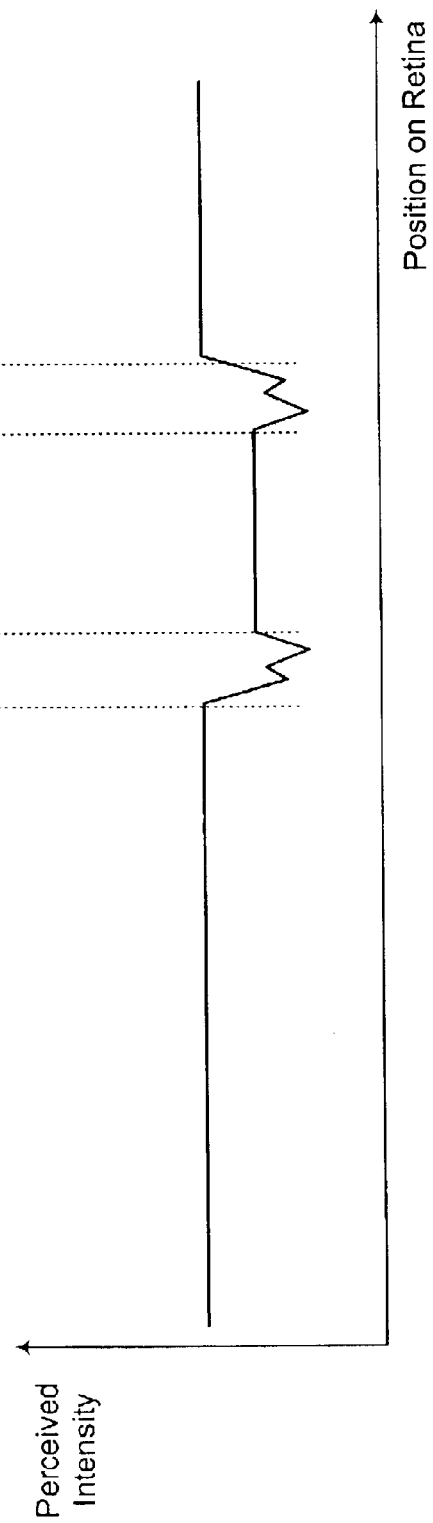
FIG. 5c illustrate the perceived illumination intensity of the pixels in FIG. 15b.
Figure 6B:
Figure 6C:

Referring to FIG. 5b, DFC artifacts are generated at the boundaries of pixels having different illumination intensities. Specifically, pixels 9 and 10 have different distribution of illumination intensities. The averaged illumination intensity, thus the perceived illumination intensity, varies in the boundary of the two pixels, as show in FIG. 5c. This variation is perceived by the viewer's eyes as the "real" contour of the object. For the same reason, another DFC artifact is generated at the boundary of pixels 13 and 14.

In order to reduce these perceived DFC artifacts, these original DFC artifacts are intentionally reproduced between selected pixels and distributed over the pixel row. To attain this purpose, a second set of PWM waveforms, which is different from the first set of waveforms corresponding for driving the pixels to display desired grayscales, is generated. In the embodiment of the invention, a second set of PWM is generated based on a second PWM waveform format, as shown in FIG. 7. The second waveform format is a binary-weighted waveform format starting from the MSB and ending at the LSB. FIGS. 8a and 8b show two exemplary PWM waveforms generated based on such waveform format. Referring to FIG. 8a, the waveform is in "ON" state for the first 8 segments of the frame duration T and turned "OFF" for the rest 7 segments. Referring to FIG. 8b, the waveform is "OFF" for the first 12 segments of the frame duration T and turned "ON" for the rest 3 segments. The generated waveforms in FIGS. 6b, 6c, 8a and 8b are applied concurrently for driving the pixels of the row for reproducing the DFC artifacts, as shown in FIG. 10a.

Figure 10A:
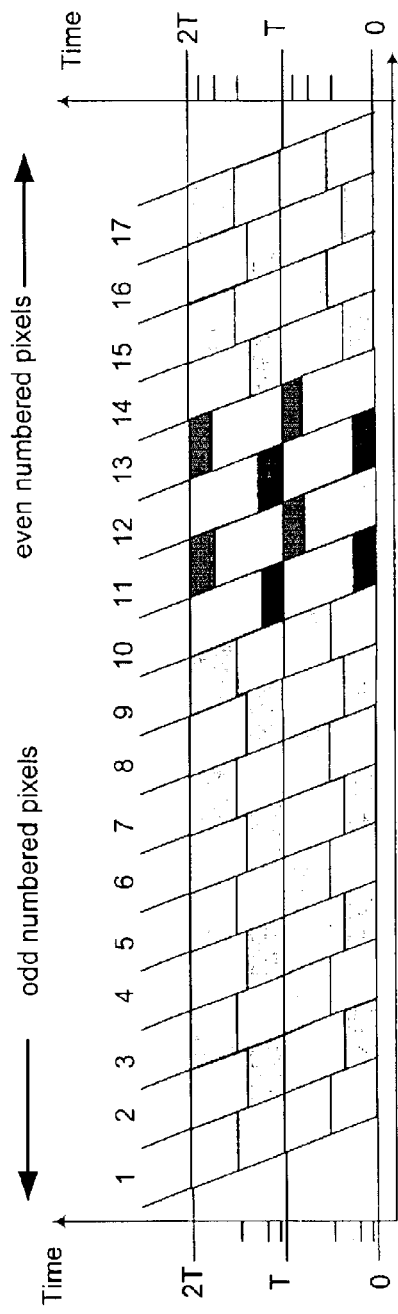
Figure 10B:
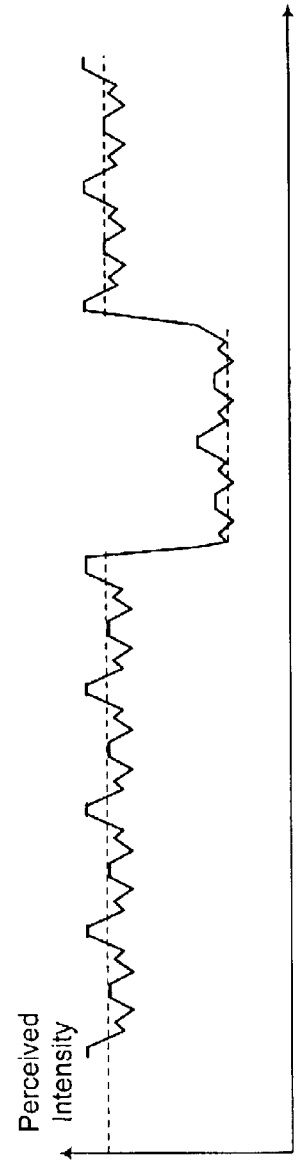

Referring to FIG. 10a, odd numbered pixels 1 to 9, 15 and 17 are driven by the waveform in FIG. 6b. Odd numbered pixels 11 and 13 are driven by the waveform in FIG. 6c. Because these waveforms are generated according to the desired grayscales of the images, the perceived grayscales of these odd numbered pixels by viewer's eyes correspond to the desired grayscales of the images. To reproduce the DFC contouring, the waveform in FIG. 8a is applied to the even numbered pixels 2 to 8, 14 and 16. And the waveform in FIG. 8b is applied to the even numbered pixels 10 and 12. As a consequence, neighboring memory cells are modulated with different waveforms. The averaged illumination intensity varies in each boundary of neighboring odd and even numbered pixels, as shown in FIG. 10b.

Referring to 10b, DFC artifacts are reproduced in the pixel row. As can been seen, the illumination intensity varies in a small range relative to background illumination intensities, represented by dash lines in the figure. The background illumination intensities correspond to the averaged illumination intensities, shown in FIG. 5c, and desired grayscales of the image. Because of this, the reproduced DFC artifacts are perceived as background "noise" by the viewer.

As described above, the pixels are selectively modulated with different waveforms. This modulation is controlled by the memory cells of row 500 in FIG. 4. Because the neighboring memory cells are connected to and capable of being activated by separate wordlines, the associated neighboring pixels can be driven independently by separate waveforms. For example, odd numbered memory cells are activated by wordline 530. The odd memory cells 1 to 9, 15 and 17 can be written according to the PWM waveform in FIG. 6b, and the odd numbered memory cells 11 and 13 can be written according to the PWM waveform in FIG. 6c. Specifically, the odd numbered memory cells 1 to 9, 15 and 17 are set to a voltage state corresponding to the "OFF" state of the pixels for the first 7 segments of the frame duration T, and set to another voltage state corresponding to the "ON" state for the rest 8 segments. The memory cells 11 and 13 are set to the same voltage state corresponding to the "OFF" state for the first 3 segments of the frame duration and set to the same another voltage state corresponding to the "ON" state of the pixels. In this way, the odd numbered pixels associated with the odd numbered memory cells are tuned "ON" and "OFF" according to the desired waveforms for displaying the desired grayscales of the images.

Independent from the activation and update of the odd numbered memory cells, the even numbered memory cells are activated and updated by wordline 510 in FIG. 4. The even numbered memory cells 2 to 8, 14 and 16 are then written according to the PWM waveform in FIG. 8a, and the even numbered memory cells 10 and 12 are written according to the PWM waveform in FIG. 8b. Specifically, the even numbered memory cells 2 to 8, 14 and 16 are set to the voltage state corresponding to the "ON" state for the first 8 waveform segments of the frame duration T and set to the voltage state corresponding to the "OFF" state for the rest 7 segments. The even numbered memory cells 10 and 12 are set to the voltage state corresponding to the "OFF" state for the first 12 segments of the frame duration T and to the voltage state corresponding to the "ON" state for the rest 3 segments. It can be seen that the even and odd numbered memory cells are activated and written independently, the associated even and odd numbered pixels are thus updated independently and driven by separate waveforms. Thereby, differences of illumination intensities, and thus DFC artifacts, are created at the boundaries of even and odd numbered pixels.

Figure 11:
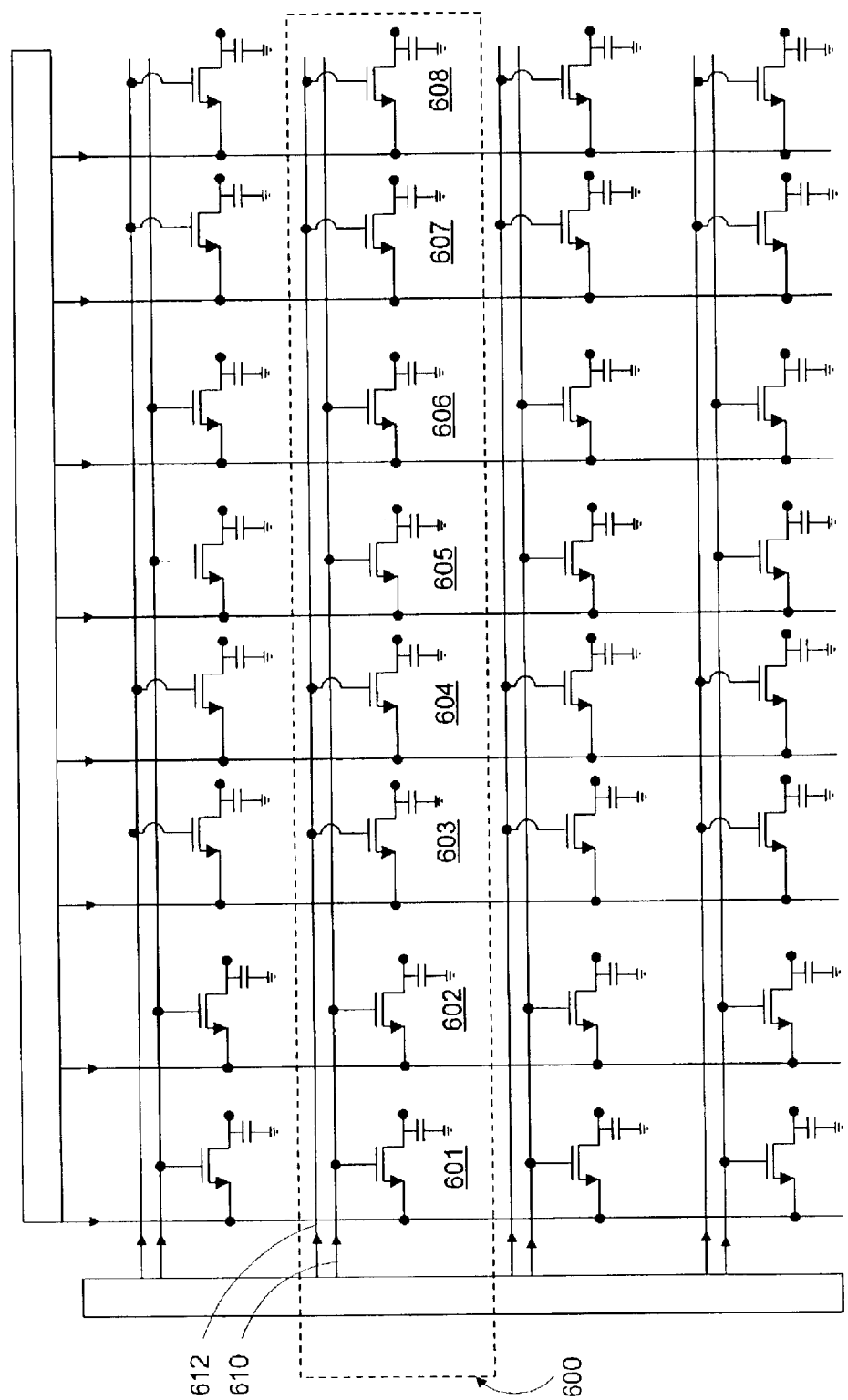
FIG. 11 illustrates a memory cell array having dual wordlines for each row of the memory cell array according to another embodiment of the invention.

In the above described embodiments, the memory cells of each row of the memory cell array are grouped such that neighboring memory cells are in different subgroups and connected to separate wordlines. According to another embodiment of the invention, the memory cells of each of the memory cell array are grouped such that the positions of the memory cells in different subgroups are interleaved in the row, as shown in FIG. 11. Referring to FIG. 11, memory cells 601, 602, 605 and 606 of row 600 are in the same subgroup and are connected to the same wordline (e.g. wordline 610). Memory cells 603, 604, 607 and 608 of row 600 are grouped in another subgroup and are connected to wordline 612 that is separate from wordline 610.

Figure 12:
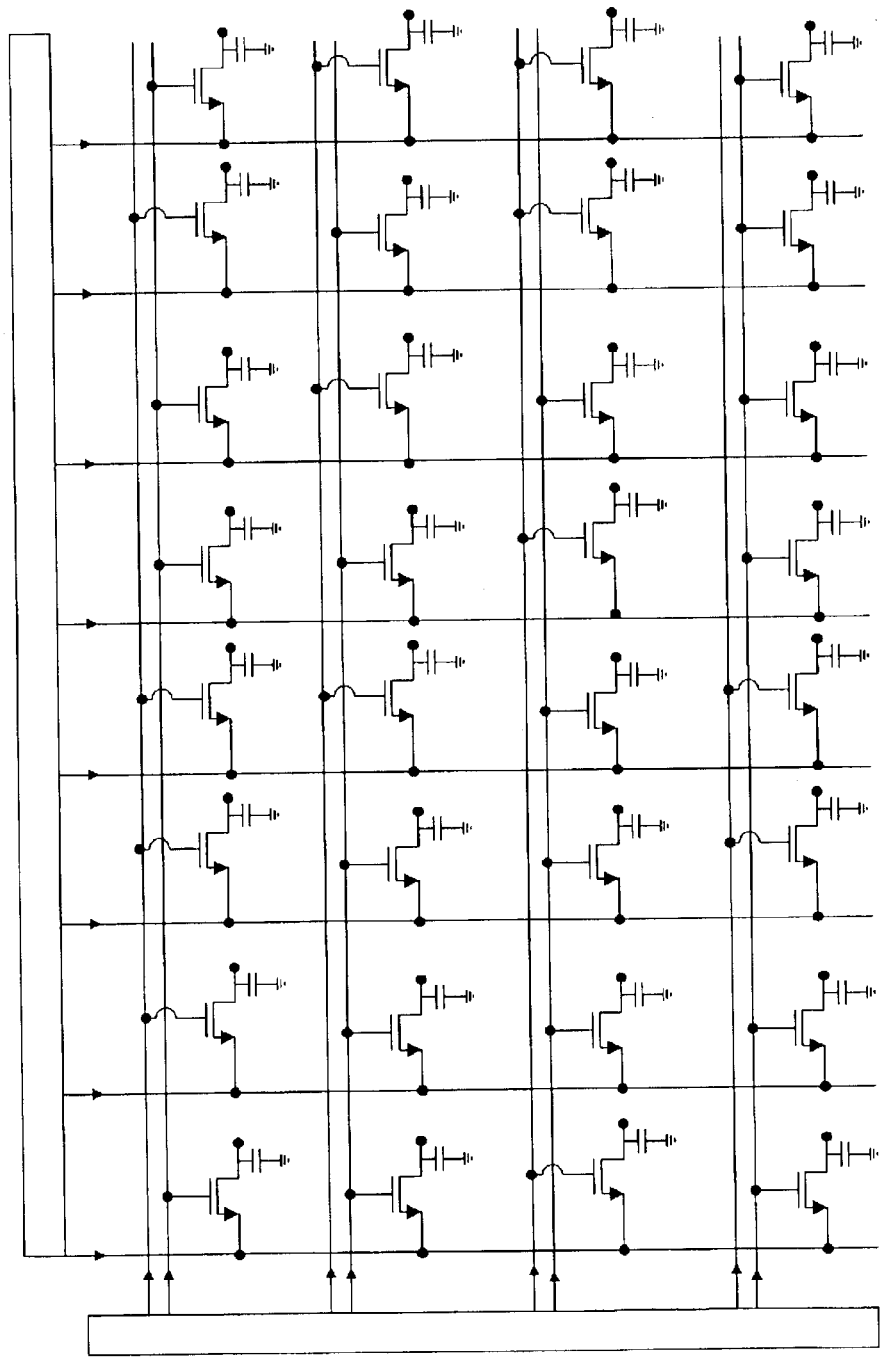
FIG. 12 illustrates a memory cell array having dual wordlines for each row of the memory cell array according to yet another embodiment of the invention.

In yet another embodiment of the invention, memory cells of each row of the memory cell array are grouped randomly and at least two memory cells in the same row are grouped into different subgroups, as shown in FIG. 12.

Reading Voltage States of Memory Cells of the Array

Figure 13:
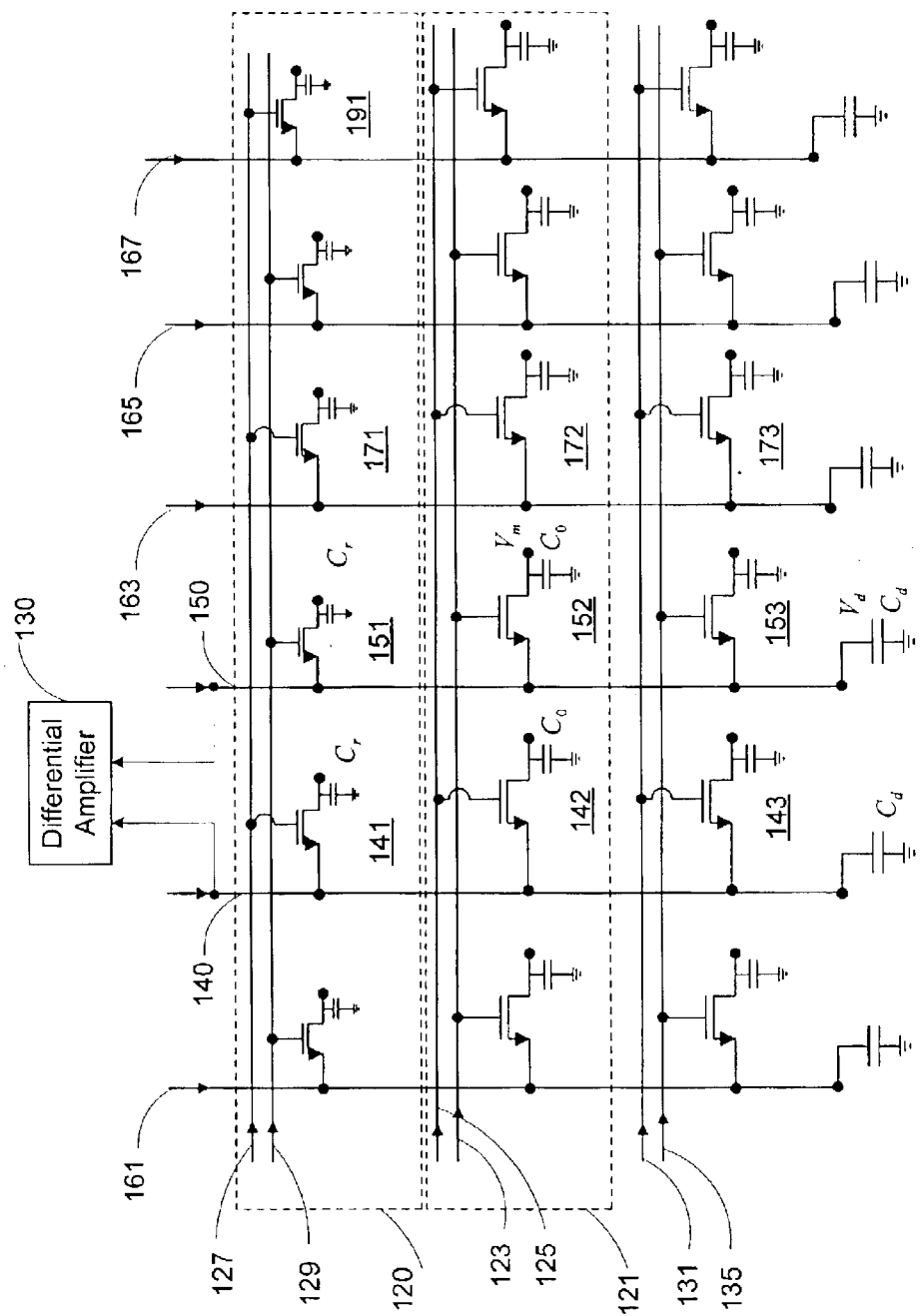
FIG. 13 is a memory cell array, on which methods for reading voltage states of the memory cells can be operated according to an embodiment of the invention.

As another application, the provision of multiple wordlines for each row of a memory cell array enables readout of voltages maintained by memory cells of spatial light modulators. This is of particular importance in improving the testability of the display systems and debugging, i.e. malfunctions of the display system. Referring to FIG. 13, the voltage $V_m$ maintained by memory cell 152 is to be measured. In general, $V_m$ is difficult to be measured precisely and directly (e.g. by directly measuring the voltage across the capacitor $C_0$). This arises from facts that $C_0$ is much smaller than the distributed capacitor $C_d$, and $V_m$ (maintained by $C_0$) is superpositioned with $V_d$ (maintained by $C_d$) that is much larger than $V_m$. $C_d$ is a distributed capacitor that is formed for example, by parasitic capacitance of the bitlines. An efficient way to precisely measure $V_m$ is to extract $V_m$ from the large voltage background $V_d$ using a differential amplifier (e.g. 130 in FIG. 13). The differential amplifier concurrently measures a signal from the memory cells to be measured and a reference voltage signal. The large voltage background (e.g. $V_d$) that is common to the two signals will be removed from the two measured signals, and the small difference of the two voltage signals is extracted and amplified for precise measurement. Given the reference signal, the small voltage $V_m$ can thus be determined.

In order to reading voltage signals of memory cells of a memory cell array, a row of reference memory cells is provided for the memory cell array. Each reference memory cell can maintain a predefined voltage state different from the voltage states of the memory cells. In a voltage reading process, a reference memory cells is selected and set to the predefined voltage state. The memory cell being read, as well as the selected reference memory cell, is activated. The other memory cells, including the memory cells in the same columns with the memory cell being read and the selected reference memory cell, and the reference cell in the same column with the memory cell being read, are deactivated. This deactivation guarantees that the voltage signal of the bitline connecting the selected reference cell is a superposition of a known voltage signal (e.g. the predefined voltage) on a large voltage signal of a distributed capacitor of the bitline. Assuming the distributed capacitors of the two bitlines connecting the reference memory cell and the memory cell being read are the same, two voltage signals from these two bitlines are measured and differentiated. Thereby, the common background voltage signal of the two distributed capacitors of the two bitlines is removed. The difference of the two voltage signals can then be amplified for precise comparison. Given that the signal from the reference memory cell is known (being the predefined voltage); the voltage of the memory cell being read can thus be deduced.

In order to set the selected reference memory cell into the predefined voltage state, and deactivate the other memory cells and reference memory cells in the same columns as the selected reference memory cell and the memory cell being read, at least a first and second sets of wordlines are provided for the memory cell array for activating the memory cells as appropriate. And a first and second sets of bitlines are connected to the memory cells for updating the activate memory cells. Specifically, each memory cell is connected to one wordline and one bitline. The memory cells in each row of the memory cell array are connected to at least a wordline from the first set of wordlines and another wordline from the second set of wordlines. Memory cells of the same column are connected to one bitline. Bitlines of the first bitline set are connected to the memory cells that are connected to the wordlines of the first wordline set. And similarly, for the bitlines of the second bitline set. With this configuration, a reference memory cell can be properly selected for reading a memory cell. The selected reference memory cell is connected to a reference wordline and a reference bitline, wherein the reference wordline is in a different wordline-set from the wordline-set comprising the wordline connecting the memory cell being read. And the reference bitline is also in a different bitline-set from the bitline-set comprising the bitline connecting the memory cell being read. In this way, the selected reference memory cell can be set to the predefined voltage state. The memory cells, other than the memory cell being read, can be deactivated when voltage signals are measured from the bitlines connecting the selected reference cell and the memory cell being read.

In a typical current fabrication process, bitlines connecting memory cells are fabricated in pairs. As a consequence, electrical properties, such as capacitances of the distributed capacitors, of neighboring bitlines are more similar than those of non-neighboring bitlines. Given this fact, preferred reference memory cell is the reference memory cell that is connected to a bitline neighboring to the bitline connecting the memory cell being read.

The methods of reading voltage states of memory cells of the memory cell array of the present invention can be implemented in many systems and in a variety of ways. An exemplary method will be discussed in the following with respect to a memory cell array comprising dual wordlines for each row of memory cells of the memory cell array, wherein the neighboring memory cells of the row are connected to separate wordlines, as shown in FIG. 13. It will be recognized by those skilled in the art that the following description and the dual wordline configuration are for demonstration purpose only and should not be interpreted in any ways as limitations. Instead, the method of the present invention can be implemented in memory cells that comprise more than two wordlines for each row of memory cells. And the method of the present invention can also be implemented in a memory cell array, wherein the memory cells in each row of the array are connected to a plurality of wordlines according to any suitable connection ways, other than the way that neighboring memory cells are connected to separate wordlines.

Referring to FIG. 13, a memory cell array according to an embodiment of the invention is illustrated therein. As seen, reference memory cell row 120 is provided for the memory cell array. Each reference memory cell comprises a capacitor for maintaining voltages of the reference memory cell. The capacitor $C_r$ of the reference memory cell is preferably different from the capacitors of the memory cells, such as $C_0$ of 142 and 152. For example, the capacitance of $C_r$ can be determined based on the predefined voltage for measuring the voltage of memory cells. For example, assuming that the "ON" and "OFF" states of a memory cell (e.g. memory cell 152) respectively correspond to +12 volts and 0 volt. The predefined reference voltage is +6 volts. Then $C_r$ is half of $C_0$.

The wordlines and bitlines can be grouped in to different wordline and bitline sets. Memory cells in the same column are connected to wordlines of the same wordline set. And the memory cells in each row of the memory cell array are connected to a wordline from a first wordline set and another wordline from a second wordline set. For example, wordlines 127, 125 and 131 are in the first wordline set, and wordlines 129, 123 and 135 are in the second wordline set. Bitlines of the first bitline set are connected to the memory cells that are connected to the wordlines of the first wordline set. In particular, bitlines 140 and 163 are in the first bitline set because bitline 140 is connected to the memory cells (141, 142 and 143) that are connected to the wordlines (e.g. 127, 125 and 131) of the first wordline set. Similarly, bitlines 161, 150 and 165 are in the second bitline set because, for example, bitline 150 is connected to the memory cells (151, 152 and 153) that are connected to the wordlines (129, 123, and 135) of the second wordline set.

It is worthwhile to point out that, the reference memory cell row (120) is not necessarily to be formed with the memory cell array. Instead, it can be formed separately with the memory cell array. In this case, the separately formed reference memory cell row is attached to the memory cell array and connected to the wordlines and bitlines in a way as described above.

Referring to FIG. 14a, a flow chart illustrating the steps executed for reading the voltage state of a memory cell (e.g. cell 152) is presented therein. In order to measure the voltage of memory cell 152, a reference memory cell row (e.g. row 120 in FIG. 13) is provided and connected to the wordlines and bitlines as described above (step 410). Then a reference memory cell is selected from the reference memory cell row (step 412). In general, any reference memory cell that is connected to a wordline of a wordline set different from the wordline set (the second wordline set) comprising the wordline (e.g. wordline 123) connecting memory cell 152, and a bitline of a bitline set different from the bitline set (the second bitline set) comprising the bitline (e.g. bitline 150) connecting memory cell 152 can be selected. With this selection criterion, both reference memory cells 141, 171 and 191 can be selected. However, the bitlines are generally formed in pairs, for example, bitline 140 and 150 are formed in one pair, distributed capacitors of bitline 140 and 150 are more similar than the capacitors of bitlines 150 and 167. Given this fact, reference memory cell 141 connected to bitline 140 is preferred to other suitable reference memory cells, such as reference memory cell 191. After the selection, the selected reference memory cell is set to a predefined voltage (step 414), such as half of the voltage corresponding to the "ON" state of the memory cell (e.g. memory cell 152). Of course, the reference memory cell can be set to other predefined voltage levels.

In setting the selected reference memory cell to a predefined voltage, further steps may be executed, as illustrated in FIG. 14b. Referring to FIG. 14b, the wordline (wordline 127 in FIG. 13) connecting the selected reference memory cell is first activated (step 428). The activated reference memory cell is then set to the predefined reference voltage (step 430) followed by deactivating the wordline (wordline 127) connecting the reference cell (step 432). The deactivation step ensures the set voltage will not be altered in the following measurement steps.

Referring back to FIG. 14a, after setting the selected reference memory cell into a predefined reference voltage, the wordline (wordline 123 in FIG. 13) connecting memory cell 152 is activated (step 416), and the wordline (wordline 127 in FIG. 13) connecting the selected reference memory cell 141 is activated (step 418) thereafter. Voltage signals form bitlines 140 and 150 are then measured and differentiated (step 420) at differential amplifier 130. After differentiation, the large background voltage signal (e.g. the voltage signal maintained by the distributed capacitors of bitlines 140 and 150) that is common to the measured voltage signals from the bitlines 140 and 150 can be removed. And the difference of the two small voltages of the selected reference memory cell 141 and memory cell 152 is extracted. This voltage difference is amplified (step 422) at differential amplifier 130. Because one of the two differentiated voltages is known as the predefined voltage of the selected reference memory cell 141, the other voltage, as the voltage of memory cell 152 can thus be deduced (step 424). As an optional step, the selected memory cell 141 and memory cell 152 are deactivated by deactivating the wordlines 127 and 123 (step 426).

It will be appreciated by those of skill in the art that a new and useful method for operating memory cells of a memory cell array used in spatial light modulators have been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Although the invention is described with reference to DRAM memory cells in display systems employing SLM, those skilled in the art will recognize that such may be equivically replaced by any suitable memory cells, such as charge-pump pixel cell (described patent application, Ser. No. 10, 340, 162, filed on Jan. 10, 2003 to Richards), SRAM or latch and optical switches using SLM. Therefore, the invention as described herein contemplates all such embodiments as may come within the scope of the following claims and equivalents thereof.

I claim:

1. A method, comprising:
   providing a memory cell array of a spatial light modulator, the memory cell array comprising one or more rows of memory cells and at least a row of reference memory cells, wherein each memory cell can maintain a high-voltage state and a low-voltage state, wherein each row of memory cells is connected to a plurality of wordlines; and wherein the row of reference memory cells is connected to a plurality of wordlines;
   reading a voltage state of a memory-cell array, further comprising:
   selecting a reference cell, wherein the selected reference cell is connected to a wordline that is different from another wordline, the another wordline being connected to another reference cell, the another reference cell being connected to the same bitline as said memory cell;
   setting the selected reference cell to a predefined voltage;
   activating the memory cell being read;
   activating the selected reference cell;
   measuring a reference voltage signal from the bitline connecting the selected reference cell and a voltage signal from a bitline connecting the memory cell being read;
   comparing the reference voltage signal and the voltage signal;
   determining the voltage state of the memory cell based on the comparison.

2. The method of claim 1, wherein the memory cell array is associated with a micromirror array that comprises a plurality of micromirrors for electrostatically controlling the micromirrors of the micromirror array.

3. The method of claim 2, wherein the micromirror array is part of a spatial light modulator of a display system.

4. The method of claim 1, wherein each memory cell comprises a capacitor with a first capacitance; and wherein the reference cell comprises another capacitor with a second capacitance different from the first capacitance.

5. The method of claim 1, wherein the bitline connecting the selected reference cell and the bitline connecting the memory cell being read are two bitlines of a bitline pair.

6. The method of claim 1, wherein the bitline connecting the selected reference cell is adjacent to the bitline connecting the memory cell being read.

7. The method of claim 1, wherein the step of comparing the reference voltage signal and the voltage signal further comprises:
   amplifying the difference between the reference voltage signal and the voltage signal.

8. The method of claim 1, wherein the step of determining the voltage state of memory cell based on the comparison further comprises:
   if the reference voltage is greater than that of the voltage signal, setting memory cell to the low voltage state; and
   if the reference voltage is smaller than that of the voltage signal, setting memory cell to the high voltage state.

9. The method of claim 1, wherein the step of setting the selected reference cell to a predefined voltage further comprises:
   activating the wordline connecting the selected reference cell;
   setting the activated reference cell to the predefined voltage state; and
   deactivating the wordline connecting the reference cell.

10. The method of claim 1, further comprising:
    after determining the voltage states of the memory cell being read,
    deactivating the wordline connecting the memory cells and reference cells.

11. A system, comprising:
    a memory cell array comprising a plurality of memory cells;
    a first and second set of wordlines connected to the memory cells for activating the memory cells;
        wherein at least two memory cells of each row of the memory cell array are connected to at least two separate wordlines selected from the first and second sets of wordlines;
        wherein the memory cells connecting the first set of wordlines are connected to a first set of bitlines; and
        wherein the memory cells connecting the second set of wordlines are connected to a second set of bitlines;
    a row of reference memory cells comprising a plurality of reference memory cells, wherein at least two reference memory cells are respectively connected to two separate wordlines selected from first and second sets of wordlines; and
        wherein the reference memory cells connected to the wordline of the first set of wordlines are connected to the first set of bitlines; and
        wherein the reference memory cells connected to the wordline of the second set of wordlines are connected to the second set of bitlines;
    a plurality of electrodes, each of which is connected to one of the memory cells of the memory cell array such that the voltage of the electrode is determined by the voltage maintained by the connected memory cell; and
    a plurality of micromirrors, each of which is electrostatically controlled by one of the plurality of electrodes.

12. The system of claim 11 further comprising:
    a light source; and
    one or more optical elements for directing light from the light source onto the micromirrors and directing reflected light from the micromirrors onto a display target for viewing.

13. The system of claim 12, wherein the system further comprises:
    a color wheel for displaying colored images.

14. The system of claim 1 further comprising:
    a differential amplifier for measuring voltage signals from two separate bitlines.

* * * * *